US009324681B2

(12) United States Patent
Haba et al.

(10) Patent No.: US 9,324,681 B2
(45) Date of Patent: Apr. 26, 2016

(54) PIN ATTACHMENT

(71) Applicant: Tessera, Inc., San Jose, CA (US)

(72) Inventors: Belgacem Haba, Saratoga, CA (US); Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/497,572

(22) Filed: Sep. 26, 2014

(65) Prior Publication Data
US 2015/0011052 A1 Jan. 8, 2015

Related U.S. Application Data

(62) Division of application No. 12/966,225, filed on Dec. 13, 2010.

(51) Int. Cl.
*H01L 23/00* (2006.01)
*H01L 21/56* (2006.01)
(Continued)

(52) U.S. Cl.
CPC ............. *H01L 24/81* (2013.01); *H01L 21/486* (2013.01); *H01L 21/4853* (2013.01); *H01L 21/563* (2013.01); *H01L 23/3121* (2013.01); *H01L 23/49811* (2013.01); *H01L 23/5389* (2013.01); *H01L 24/97* (2013.01); *H01L 25/105* (2013.01); *H01L 25/50* (2013.01); *H01L 24/48* (2013.01); *H01L 2224/11003* (2013.01); *H01L 2224/16225* (2013.01); *H01L 2224/32225* (2013.01); *H01L 2224/48227* (2013.01); *H01L 2224/73265* (2013.01); *H01L 2224/811* (2013.01); *H01L 2224/81801* (2013.01); *H01L 2224/97* (2013.01); *H01L 2225/1023* (2013.01);
(Continued)

(58) Field of Classification Search
CPC . H01L 21/568; H01L 21/4853; H01L 21/486; H01L 24/97; H01L 24/81; H01L 21/563; H01L 23/3121; H01L 23/49811; H01L 23/5389; H01L 25/105; H01L 25/50
See application file for complete search history.

(56) References Cited

U.S. PATENT DOCUMENTS 3,289,452 A 12/1966 Koellner
3,358,897 A 12/1967 Christensen
(Continued)

FOREIGN PATENT DOCUMENTS

CN 1641832 A 7/2005
CN 1877824 A 12/2006
(Continued)

OTHER PUBLICATIONS

International Search Report and Written Opinion for Application No. PCT/US2011/024143 dated Jan. 17, 2012.
(Continued)

*Primary Examiner* — Latanya N Crawford
(74) *Attorney, Agent, or Firm* — Lerner, David, Littenberg, Krumholz & Mentlik, LLP

(57) ABSTRACT

A method for making a microelectronic package includes the steps of providing a microelectronic assembly that further includes a substrate with a plurality of conductive elements thereon, a carrier, and a plurality of substantially rigid metal elements extending from the carrier and joined to the conductive elements; and removing the carrier from the microelectronic assembly to expose contact surfaces of the respective ones of the plurality of metal elements remote from the first conductive pads.

16 Claims, 11 Drawing Sheets

(51) Int. Cl.
*H01L 21/48* (2006.01)
*H01L 23/31* (2006.01)
*H01L 23/498* (2006.01)
*H01L 23/538* (2006.01)
*H01L 25/10* (2006.01)
*H01L 25/00* (2006.01)

(52) U.S. Cl.
CPC .................. *H01L 2225/1058* (2013.01); *H01L 2225/1088* (2013.01); *H01L 2924/12042* (2013.01); *H01L 2924/14* (2013.01); *H01L 2924/15311* (2013.01); *H01L 2924/15331* (2013.01)

(56) References Cited

U.S. PATENT DOCUMENTS

| | | |
|---|---|---|
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,839,191 A | 11/1998 | Economy et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,407,448 B2 | 6/2002 | Chun |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |

(56) References Cited

U.S. PATENT DOCUMENTS

| | | |
|---|---|---|
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,778,406 B2 | 8/2004 | Eldridge et al. |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,061,079 B2 | 6/2006 | Weng et al. |
| 7,061,097 B2 | 6/2006 | Yokoi |
| 7,067,911 B1 | 6/2006 | Lin et al. |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,294,928 B2 | 11/2007 | Bang et al. |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,902,644 B2 | 3/2011 | Huang et al. |
| 7,919,846 B2 | 4/2011 | Hembree |
| 7,928,552 B1 * | 4/2011 | Cho et al. .................. 257/686 |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 * | 10/2011 | Lee et al. .................. 257/692 |
| 8,039,970 B2 | 10/2011 | Yamamori et al. |
| 8,071,431 B2 | 12/2011 | Hoang et al. |
| 8,071,470 B2 | 12/2011 | Khor et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,304,900 B2 | 11/2012 | Jang et al. |
| 8,314,492 B2 | 11/2012 | Egawa |
| 8,319,338 B1 | 11/2012 | Berry et al. |
| 8,482,111 B2 | 7/2013 | Haba |
| 8,525,314 B2 | 9/2013 | Haba et al. |
| 8,525,318 B1 | 9/2013 | Kim et al. |
| 8,659,164 B2 | 2/2014 | Haba |
| 8,680,684 B2 | 3/2014 | Haba et al. |
| 8,728,865 B2 | 5/2014 | Haba et al. |
| 8,878,353 B2 | 11/2014 | Haba et al. |
| 8,927,337 B2 | 1/2015 | Haba et al. |
| 8,987,132 B2 * | 3/2015 | Gruber ................ B23K 3/0638 438/614 |
| 2001/0002607 A1 | 6/2001 | Sugiura et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 * | 11/2002 | Miyazaki .............. H01L 21/563 257/778 |
| 2002/0185735 A1 | 12/2002 | Sakurai et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0094700 A1 | 5/2003 | Aiba et al. |

(56) References Cited

U.S. PATENT DOCUMENTS

| | | |
|---|---|---|
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1* | 8/2005 | Haba et al. ................ 439/331 |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0015353 A1 | 1/2007 | Craig et al. |
| 2007/0090524 A1 | 4/2007 | Abbott |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0277772 A1 | 11/2008 | Groenhuis et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0045497 A1 | 2/2009 | Kagaya et al. |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0127686 A1 | 5/2009 | Yang et al. |
| 2009/0128176 A1 | 5/2009 | Beaman et al. |
| 2009/0146301 A1 | 6/2009 | Shimizu et al. |
| 2009/0146303 A1* | 6/2009 | Kwon ................ 257/741 |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1* | 6/2010 | Lin ................ H01L 21/6835 |
| | | 257/737 |
| 2010/0193937 A1 | 8/2010 | Nagamatsu et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |

(56) References Cited

U.S. PATENT DOCUMENTS

| | | | |
|---|---|---|---|
| 2010/0289142 | A1 | 11/2010 | Shim et al. |
| 2010/0314748 | A1 | 12/2010 | Hsu et al. |
| 2010/0327419 | A1 | 12/2010 | Muthukumar et al. |
| 2011/0057308 | A1 | 3/2011 | Choi et al. |
| 2011/0068453 | A1 | 3/2011 | Cho et al. |
| 2011/0115081 | A1 | 5/2011 | Osumi |
| 2011/0140259 | A1 | 6/2011 | Cho et al. |
| 2011/0147911 | A1 | 6/2011 | Kohl et al. |
| 2011/0220395 | A1* | 9/2011 | Cho et al. ............. 174/250 |
| 2011/0223721 | A1 | 9/2011 | Cho et al. |
| 2011/0237027 | A1 | 9/2011 | Kim et al. |
| 2011/0241192 | A1 | 10/2011 | Ding et al. |
| 2011/0241193 | A1 | 10/2011 | Ding et al. |
| 2011/0272449 | A1 | 11/2011 | Pirkle et al. |
| 2012/0007232 | A1* | 1/2012 | Haba ............. 257/737 |
| 2012/0015481 | A1 | 1/2012 | Kim |
| 2012/0018885 | A1 | 1/2012 | Lee et al. |
| 2012/0025365 | A1* | 2/2012 | Haba ............. 257/692 |
| 2012/0043655 | A1 | 2/2012 | Khor et al. |
| 2012/0061814 | A1 | 3/2012 | Camacho et al. |
| 2012/0063090 | A1 | 3/2012 | Hsiao et al. |
| 2012/0080787 | A1 | 4/2012 | Shah et al. |
| 2012/0086130 | A1 | 4/2012 | Sasaki et al. |
| 2012/0104595 | A1* | 5/2012 | Haba et al. ............. 257/737 |
| 2012/0119380 | A1 | 5/2012 | Haba |
| 2012/0145442 | A1 | 6/2012 | Gupta et al. |
| 2012/0146235 | A1 | 6/2012 | Choi et al. |
| 2012/0184116 | A1 | 7/2012 | Pawlikowski et al. |
| 2012/0280374 | A1 | 11/2012 | Choi et al. |
| 2012/0280386 | A1 | 11/2012 | Sato et al. |
| 2013/0049221 | A1 | 2/2013 | Han et al. |
| 2013/0069222 | A1 | 3/2013 | Camacho |
| 2013/0105979 | A1 | 5/2013 | Yu et al. |
| 2013/0134588 | A1 | 5/2013 | Yu et al. |
| 2014/0036454 | A1 | 2/2014 | Caskey et al. |
| 2014/0124949 | A1 | 5/2014 | Paek et al. |

FOREIGN PATENT DOCUMENTS

| | | | |
|---|---|---|---|
| CN | 101449375 A | | 6/2009 |
| CN | 101675516 A | | 3/2010 |
| CN | 101819959 A | | 9/2010 |
| CN | 102324418 A | | 1/2012 |
| EP | 920058 | | 6/1999 |
| EP | 1449414 A1 | | 8/2004 |
| EP | 2234158 A1 | | 9/2010 |
| JP | 59189069 | | 10/1984 |
| JP | 61125062 A | | 6/1986 |
| JP | 62-226307 | | 10/1987 |
| JP | 1012769 A | | 1/1989 |
| JP | 64-71162 | | 3/1989 |
| JP | 06268015 A | | 9/1994 |
| JP | 07-122787 A | | 5/1995 |
| JP | 09505439 | | 5/1997 |
| JP | 1118364 | | 1/1999 |
| JP | 11-074295 A | | 3/1999 |
| JP | 11135663 A | | 5/1999 |
| JP | 11251350 A | | 9/1999 |
| JP | 2001196407 A | | 7/2001 |
| JP | 2001326236 A | | 11/2001 |
| JP | 2002289769 A | | 10/2002 |
| JP | 2003122611 A | | 4/2003 |
| JP | 2003-174124 A | | 6/2003 |
| JP | 2003307897 A | | 10/2003 |
| JP | 2004281514 A | | 10/2004 |
| JP | 2004327856 A | | 11/2004 |
| JP | 2004343030 A | | 12/2004 |
| JP | 2005011874 A | | 1/2005 |
| JP | 2003377641 A | | 6/2005 |
| JP | 2005142378 A | | 6/2005 |
| JP | 2005175019 A | | 6/2005 |
| JP | 2003426392 A | | 7/2005 |
| JP | 2005183880 A | | 7/2005 |
| JP | 2005183923 A | | 7/2005 |
| JP | 2005203497 A | | 7/2005 |
| JP | 2005302765 A | | 10/2005 |
| JP | 2006186086 A | | 7/2006 |
| JP | 2006344917 | | 12/2006 |
| JP | 2007123595 A | | 5/2007 |
| JP | 2007287922 A | | 11/2007 |
| JP | 2007-335464 | | 12/2007 |
| JP | 2008251794 A | | 10/2008 |
| JP | 2009004650 A | | 1/2009 |
| JP | 2009506553 | | 2/2009 |
| JP | 2009260132 A | | 11/2009 |
| JP | 2010103129 A | | 5/2010 |
| JP | 2010206007 A | | 9/2010 |
| KR | 100265563 | | 9/2000 |
| KR | 2001-0094894 A | | 11/2001 |
| KR | 10-0393102 | | 7/2002 |
| KR | 20020058216 A | | 7/2002 |
| KR | 20060064291 A | | 6/2006 |
| KR | 20080020069 A | | 3/2008 |
| KR | 100865125 B1 | | 10/2008 |
| KR | 20080094251 A | | 10/2008 |
| KR | 100886100 B1 | | 2/2009 |
| KR | 20090033605 A | | 4/2009 |
| KR | 20090123680 A | | 12/2009 |
| KR | 20100033012 A | | 3/2010 |
| KR | 20100062315 A | | 6/2010 |
| KR | 101011863 B1 | | 1/2011 |
| KR | 20150012285 A | | 2/2015 |
| TW | 200810079 A | | 2/2008 |
| TW | 200933760 A | | 8/2009 |
| TW | 201023277 A | | 6/2010 |
| WO | 02/13256 A1 | | 2/2002 |
| WO | 03045123 A1 | | 5/2003 |
| WO | 2006050691 A2 | | 5/2006 |
| WO | 2008065896 A1 | | 6/2008 |
| WO | 2008120755 A1 | | 10/2008 |
| WO | 2010041630 A1 | | 4/2010 |
| WO | 2010101163 A1 | | 9/2010 |
| WO | 2014107301 A1 | | 7/2014 |

OTHER PUBLICATIONS

"EE Times Asia" [online]. [Retrieved Aug. 5, 2010]. Retrieved from internet. <http://www.eetasia.com/ART_8800428222_480300_nt_dec52276.HTM>, 4 pages.

"Wafer Level Stack—WDoD", [online]. [Retrieved Aug. 5, 2010]. Retrieved from the internet. <http://www.3d-plus.com/techno-wafer-level-stack-wdod.php>, 2 pages.

Bang, U.S. Appl. No. 10/656,534, filed Sep. 5, 2003.

Extended European Search Report for Application No. EP13162975 dated Sep. 5, 2013.

International Search Report and Written Opinion for Application No. PCT/US2011/044346 dated May 11, 2012.

International Search Report and Written Opinion for Application No. PCT/US2012/060402 dated Apr. 2, 2013.

International Search Report and Written Opinion for Application No. PCT/US2013/041981 dated Nov. 13, 2013.

International Search Report and Written Opinion for Application No. PCT/US2013/052883 dated Oct. 21, 2013.

International Search Report and Written Opinion for Application No. PCT/US2013/053437 dated Nov. 25, 2013.

International Search Report and Written Opinion for Application No. PCT/US2013/075672 dated Apr. 22, 2014.

International Search Report and Written Opinion for PCT/US2011/060551 dated Apr. 18, 2012.

International Search Report and Written Opinion PCT/US2011/044342 dated May 7, 2012.

International Search Report Application No. PCT/US2011/024143, dated Sep. 14, 2011.

International Search Report, PCT/US2005/039716, Apr. 5, 2006.

Japanese Office Action for Application No. 2013-509325 dated Oct. 18, 2013.

Jin, Yonggang et al., "STM 3D-IC Package and 3D eWLB Development," STMicroelectronics Singapore/STMicroelectronics France May 21, 2010.

(56) References Cited

OTHER PUBLICATIONS

Kim et al., "Application of Through Mold Via (TMV) as PoP base package", 6 pages (2008).
Korean Search Report KR10-2011-0041843 dated Feb. 24, 2011.
Meiser S, "Klein Und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).
Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Office Action for Taiwan Application No. 100125521 dated Dec. 20. 2013.
Office Action from Taiwan for Application No. 100125522 dated Jan. 27, 2014.
Office Action from U.S. Appl. No. 12/769,930 mailed May 5, 2011.
Partial International Search Report for Application No. PCT/US2012/060402 dated Feb. 21, 2013.
Partial International Search Report for Application No. PCT/US2013/026126 dated Jun. 17, 2013.
Partial International Search Report for Application No. PCT/US2013/075672 dated Mar. 12, 2014.
Partial International Search Report from Invitation to Pay Additional Fees for Application No. PCT/US2012/028738 dated Jun. 6, 2012.
Redistributed Chip Package (RCP) Technology, Freescale Semiconductor, 2005, 6 pages.
Search Report from Korean Patent Applicatin No. 10-2010-0113271 dated Jan. 12, 2011.
Taiwanese Office Action for Application No. 100141695 dated Mar. 19, 2014.
Taiwanese Office Action for Application No. 101138311 dated Jun. 27, 2014.
Yoon, PhD, Seung Wook, "Next Generation Wafer Level Packaging Solution for 3D integration," May 2010, STATS ChipPAC Ltd.
International Search Report and Written Opinion for Application No. PCT/US2013/026126 dated Jul. 25, 2013.
Chinese Office Action for Application No. 201180022247.8 dated Sep. 16, 2014.
Japanese Office Action for Application No. 2013-520777 dated May 22, 2015.
Chinese Office Action for Application No. 201310264264.3 dated May 12, 2015.
Taiwanese Office Action for Application No. 100140428 dated Jan. 26, 2015.
Korean Office Action for Application No. 2014-7025992 dated Feb. 5, 2015.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.

* cited by examiner

PIN ATTACHMENT

CROSS-REFERENCE TO RELATED APPLICATIONS

This application is a divisional of U.S. application Ser. No. 12/966,225, filed on Dec. 13, 2010, the disclosure of which is incorporated herein by reference.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited.

Despite all of the above-described advances in the art, still further improvements in making and testing microelectronic packages would be desirable.

SUMMARY OF THE INVENTION

An embodiment of the present invention relates to a microelectronic package. In one embodiment, the microelectronic package includes a substrate having a first region and a second region and further having a first surface and a second surface remote from the first surface. At least one microelectronic element overlies the first region on the first surface. First electrically conductive elements are exposed at one of the first surface and the second surface of the substrate within the second region with at least some of the first conductive elements electrically connected to the at least one microelectronic element. Substantially rigid metal elements overlie the first conductive elements and have end surfaces remote therefrom. A bond metal joins the metal elements with the first conductive elements, and a molded dielectric layer overlies at least the second region of the substrate and has a surface remote from the substrate. The end surfaces of the metal elements are at least partially exposed at the surface of the molded dielectric layer.

At least some of the first conductive elements can be exposed at the second surface of the substrate within the second region. Further, the molded dielectric layer can overlie at least the second surface of the substrate. Additionally or alternatively, the first conductive elements can be exposed at the first surface of the substrate within the second region and the molded dielectric layer can overlie at least the first surface of the substrate. Such an embodiment can further include second conductive elements exposed at the second surface of the substrate and electrically connected with at least some of the first conductive elements. In various embodiments, the molded dielectric layer can further overlie the microelectronic element. Further embodiments are possible that include an encapsulant layer that is not molded in place of the molded dielectric layer.

In an embodiment, a first one of the metal elements can be adapted for carrying a first signal electric potential and a second one of the metal elements can be adapted for simultaneously carrying a second electric potential. The second electric potential can be different from said first signal electric potential.

In various embodiments, the molded dielectric layer can be formed in different regions wherein respective major surfaces thereof have different heights above the substrate. These regions can correspond to the first and second regions of the substrate. In further embodiments, the end surfaces of the metal elements can be coplanar with the surface of the molded dielectric layer or can be positioned above the surface or below the surface with holes in the molded dielectric layer that expose the ends. In a still further embodiment, a redistribution layer including conductive pads can be formed on the surface of the molded dielectric layer.

In an embodiment, the metal elements of the microelectronic package can taper from greater widths at the end surfaces in a direction towards the first conductive elements. The metal elements can further have surfaces of revolution about an axis, which can include a frustroconical shape or a cylindrical shape. The microelectronic package can be structured such that the height of the metal elements extends through at least 60% of the thickness of the molded dielectric layer. Alternatively, the height of the bond metal can extend through at least 60% of the thickness of the molded dielectric layer.

A microelectronic package according to various embodiments of the present invention can be included in a microelectronic assembly that further includes a second microelectronic package. The second microelectronic package can include an outer surface having a plurality of connection elements exposed at a surface thereof and a microelectronic element electrically connected to the connection elements. At least a portion of the outer surface of the second microelectronic package can overlie at least a portion of the surface of the molded dielectric layer and the connection elements of the second microelectronic package can be electrically and mechanically connected to the end surfaces of the conductive projections of the first microelectronic package.

A further embodiment of the present invention relates to a method for making a microelectronic package that includes providing a microelectronic assembly having a first substrate. The first substrate includes a first surface with a plurality of electrically conductive elements exposed thereon, a carrier having a second surface spaced apart from the first surface of the substrate, and a plurality of substantially rigid metal elements extending from the carrier and joined to the conductive elements. The method further includes removing the carrier from the microelectronic assembly, thereby exposing contact surfaces of respective ones of the plurality of metal elements remote from the first conductive pads. In an embodiment, the step of removing the carrier includes at least one of etching, lapping or peeling the carrier. In a further embodiment, a dielectric material can be injected between the first and second surfaces and around the conductive projections, prior to removing the carrier, to form a molded dielectric layer.

The microelectronic subassembly can be formed from a first subassembly including the first substrate and the conductive elements and a second subassembly including the carrier and the metal elements. In such an embodiment, the metal elements can have first surfaces remote from the second surface and that are exposed prior to attaching the first surfaces of the metal elements to the conductive elements of the second subassembly. The metal elements can be attached, by at least the first surfaces thereof, to the conductive pads of the second assembly by forming a plurality of masses of bonding metal that are affixed to the first surfaces of the conductive projections and to respective ones of the conductive elements such that at least a portion of the bonding metal is disposed between the first surfaces and the conductive elements.

In an embodiment, the microelectronic assembly further includes a microelectronic element that can be affixed on the substrate and electronically connected to at least some of the conductive elements. The microelectronic element can be affixed on the first substrate prior to the step of removing the carrier or thereafter.

In a further embodiment, the first surface of the first substrate can include first and second regions, the conductive elements being exposed at the first surface within the first region and the microelectronic element being attached on the first surface within the second region. A dielectric layer can be molded over the first and second regions of the first surface and at least a portion of said microelectronic element. This can be done such that the molded dielectric layer includes an outer surface, and the contact surfaces of the metal elements can be exposed at the outer surface of the molded dielectric layer. The molded dielectric layer can further be formed in a first dielectric layer portion and a second dielectric layer portion by the steps of that are formed over the different regions thereof. Further, the portions of the molded dielectric layer over the first and second regions can be molded having different respective heights.

In a still further embodiment, the first subassembly can be formed including the steps of affixing a rigid metal layer to the second surface, depositing masses of a bonding metal along selected portions of the rigid metal layer such that first surfaces are defined on the masses of the bonding metal, and removing areas of the rigid metal layer outside of the selected portions thereof. A mask layer can be deposited over the rigid metal layer, such that the mask layer has a plurality of openings therethrough that expose the selected portions of the metal layer. The step of depositing the masses of the bonding metal can include depositing the masses within the openings. In an embodiment, the mask layer can act as at least a portion of an encapsulant layer formed after the step of transferring the conductive projections.

Any one of the embodiments discussed can be used in a system including the microelectronic assembly and one or more other electronic components electrically connected to the assembly. The system can further include a housing within which the microelectronic assembly and the other electronic components are mounted.

DETAILED DESCRIPTION

Figure 1:
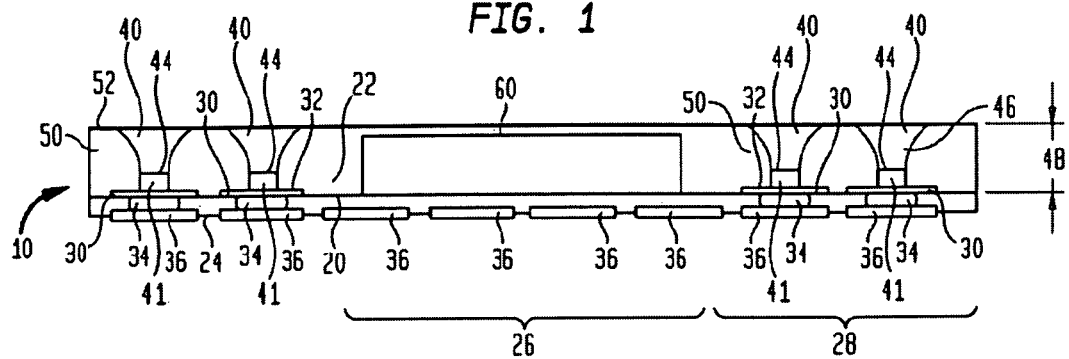
FIG. 1 shows a microelectronic assembly according to an embodiment of the present invention.

Turning now to the figures, where similar numeric references are used to indicate similar features, there is shown in FIG. 1 a microelectronic assembly according to an embodiment of the present invention. The embodiment of FIG. 1 is a microelectronic assembly in the form of a packaged microelectronic element such as a semiconductor chip assembly that is used in computer or other electronic applications.

The microelectronic assembly 10 of FIG. 1 includes a substrate 20 having a first surface 22 and a second surface 24. The substrate is generally in the form of a dielectric wafer material that forms a substantially flat, thin sheet. The substrate is preferably formed from silicon or other dielectric materials understood in the art to be acceptable for the applications described herein in the semiconductor chip arts. The first surface 20 and second surface 22 are preferably substantially parallel to each other and are spaced apart at a distance perpendicular to the surfaces 22,24 defining the thickness of the substrate 20. The thickness of substrate 20 is preferably within a range of generally acceptable thicknesses for the present application as would be understood by a person of ordinary skill in the art upon reading this description. In an embodiment the distance between the first surface 22 and the second surface 24 is between about 25 and 500 µm. For purposes of this discussion, the first surface 22 may be described as being positioned "above" second surface 24. Such a description, as well as any other description of the relative position of elements used herein that refers to a vertical or horizontal position of such elements is made for illustrative purposes only to correspond with the position of the elements within the Figures, and is not limiting.

In a preferred embodiment, substrate 20 is considered as divided into a first region 26 and a second region 28. The first region 26 lies within the second region and includes a central portion of the substrate 20 and extends outwardly therefrom. The second region 28 substantially surrounds the first region 26 and extends outwardly therefrom to the outer edges of the substrate 20. Preferably, no specific characteristic of the substrate itself physically divides the two regions; however, the regions are demarked for purposes of discussion herein with respect to treatments or features applied thereto or contained therein.

A microelectronic element 60 is affixed on first surface 22 of substrate 20 within first region 28. Microelectronic element 60 can be a semiconductor chip or another comparable device. In one embodiment, microelectronic element 60 can be affixed to first surface 22 in what is known as a conventional or "face-up" fashion. In such a case wire leads (not shown) can be used to electrically connect microelectronic element 60 to conductive elements 30 exposed at first surface 22, which may be done by connecting such wire leads to traces (not shown) or other conductive features within substrate 20 that are, in turn, connected to conductive elements 30.

A set of first conductive elements 30 are exposed at the first surface 22 of substrate 20. As used in the present description, when an element is described as being "exposed at" another element, such as a surface or the like, "exposed at" indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric. The conductive elements 30 can be flat, thin elements forming a first face 32 that is exposed at first surface 22 of substrate 20. In one embodiment, conductive elements 30 can be in the form of substantially circular pads that may be interconnected between each other or to microelectronic element 60 by traces (not shown). Conductive elements 30 can be formed at least within second region 28 of substrate 20. Additionally, in certain embodiments, conductive elements 30 can also be formed within first region 26. Such an arrangement is particularly useful when affixing microelectronic element 60 to substrate 20 in what is known as a "flip-chip" configuration, where contacts on the microelectronic element 60 can be connected to conductive elements 30 within first region 26 by solder bumps (not shown) or the like that are positioned beneath microelectronic element 60.

Preferably, conductive elements 30 are formed from a solid metal material such as copper, gold, nickel, or other materials known in the art for such an application, including various alloys including one or more of copper, gold, nickel or combinations thereof.

At least some of conductive elements 30 can be interconnected to corresponding second conductive elements 36, such as conductive pads, exposed at second surface 24 of substrate 20. Such an interconnection can be completed using vias 34 formed in substrate 20 that can be lined or filled with conductive metal that can be of the same material as conductive elements 30 and 36. Optionally, conductive elements 36 can be further interconnected by traces on substrate 20.

Assembly 10 also includes a plurality of substantially rigid metal elements 40 affixed on at least some of conductive elements 30. Metal elements 40 can be affixed on conductive elements 30 within first region 26 of substrate 20. Metal elements 40 extend away from conductive elements 30 to an end surface 42 spaced above, or otherwise remote, from conductive elements 30. In an alternative embodiment, metal elements 40 can be affixed on conductive elements 36 that are exposed at second surface 24. In such an embodiment, metal elements 40 would extend to an end surface 42 below conductive elements 36.

Metal elements 40 are affixed to conductive elements 30 by a bond metal mass 41. Bond metal mass 41 is comprised of any conductive material that is known for affixing two rigid or solid metal elements to each other and can be a material having a relatively low melting point (i.e. below about 300° C.) such that it can be melted to achieve such affixing without melting the adjacent solid metal portions or any other components of the microelectronic assembly 10. Bond metal mass 41 can include a fusible metal such as solder, tin or indium, or which can be a metal or metal alloy having a melting temperature below 300° C. Metal elements 40 are can be formed from a material having a relatively high melting point such that it can withstand the melting temperature of the bond metal mass 41. Further, metal elements 40 can be formed, for example, from a metal known for having reliable conductive properties, which can be copper, gold, nickel or alloys having various mixtures thereof or including other metals.

Bond metal mass 41 is affixed on first face 32 of a corresponding conductive element 30. Metal element 40 includes a base 44 remote from end surface 42 and an edge surface 46 extending between base 44 and end surface 42. Base 44 of metal element 40 is affixed to bond metal mass 41. Base 44 can be spaced apart from face 32 such that bond metal mass 41 is interposed therebetween. Further, some of bond metal mass 41 may extend upwardly along a portion of the edge surface 46 of metal element 40. Thus, bond metal mass 41 can be formed as a solder mass on face 32 of a corresponding conductive element 30 with metal element 40 held partially therein. Further, in an embodiment, bond metal mass 41 can extend upwardly along substantially all of edge surface 46. Still further, some of bond metal mass 41 can wick upwardly along a portion of metal element 40.

Metal element 40 can be formed such that end surface 42 is at least as wide as base 44. The width of each of base 44 and end surface 42 is measured in a dimension perpendicular to a longitudinal axis formed by the metal element 40. This direction can also be described as being parallel to face 32 or first surface 22. In an embodiment, metal element 40 is a body of revolution such that base 44 and end surface 42 are substantially circular and such that edge surface 46 is a surface of revolution extending therebetween. In such an embodiment the width of base 44 and end surface 42 are measured as the diameters thereof. In an embodiment, metal element 40 is a truncated cone (a cone that is cut off between the base and the apex thereof such that it has two parallel flat surfaces). Alternatively, metal element 40 can be a hyperboloid, or a revolved paraboloid, wherein the axis of rotation is outside the apex of the parabola. In any of those embodiments, end surface 44 is wider than base 42. Further alternative shapes and structures for metal element 40 and for conductive projection 40 in its entirety are contemplated and are discussed further below.

In the embodiment of FIG. 1, metal element 40 is constructed such that it extends through a majority of the height 48 of package 10. In such an embodiment, metal element 40 can extend through at least 60% of the height 48. In a variation of such an embodiment, metal element 40 extends through about 80% to about 90% of height 48. The percentage of the height through which metal element 40 extends is measured irrespective of any amount of bond metal mass 41 extends along edge surface 46.

Microelectronic assembly 10 further includes encapsulant layer 50. In the embodiment of FIG. 1, encapsulant layer 50 is formed over the portions of first surface 22 of substrate 20 that are not otherwise covered by or occupied by microelectronic element 60, or conductive elements 30. Similarly, encapsulant layer 50 is formed over the portions of conductive elements 30, including face 32 thereof, that are not otherwise covered by metal elements 40 or bond metal masses 41. Encapsulant layer 50 can also substantially cover microelectronic element 60, as well as bond metal mass 41 and edge surface 46 of metal element 40. End surfaces 42 of metal elements 40 remain exposed at a major surface 52 defined by encapsulant layer 50. In other words, encapsulant layer 50 can cover all of microelectronic assembly 10 from first surface 22 and above, with the exception of end surfaces 42.

Encapsulant layer 50 serves to protect the other elements within microelectronic assembly 10, particularly metal elements 40 and bond metal masses 41. This allows for a more robust structure that is less likely to be damaged by testing thereof or during transportation or assembly to other microelectronic structures. Encapsulant layer 50 can be formed from a dielectric material with insulating properties such as that described in U.S. Patent App. Pub. No. 2010/0232129, which is incorporated by reference herein in its entirety.

Figure 2:
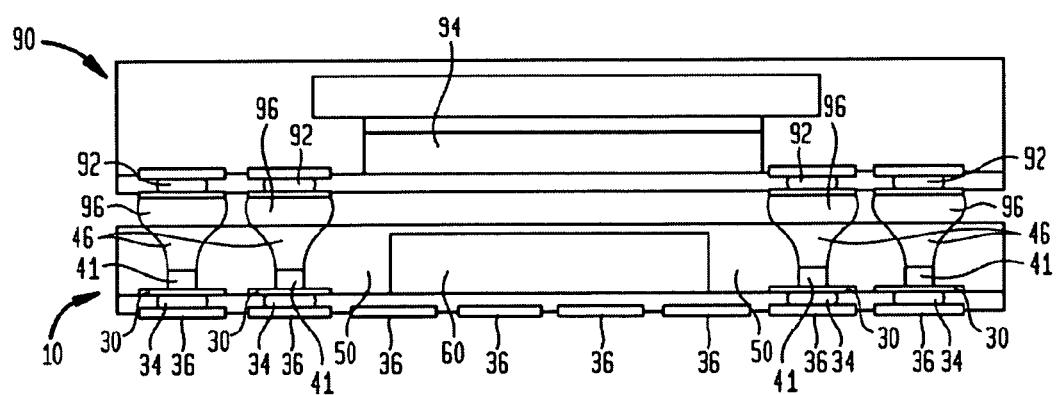
FIG. 2 shows the microelectronic assembly of FIG. 1 connected to a second microelectronic assembly in a stacked relationship therewith.

The structure of the embodiment of FIG. 1, with secondary conductive elements 36 exposed at second surface 24 and end surfaces 42 of metal elements 40, is such that connection to another electronic component can be completed from either below or above microelectronic assembly 10. This allows microelectronic assembly 10 to be mounted to either a semiconductor chip or another microelectronic assembly in either an upright or inverted configuration. It further allows for testing thereof from either the top or the bottom. Further still, microelectronic assembly 10 can be stacked, as shown in FIG. 2, with another microelectronic assembly 90 having its own contact pads 92 and microelectronic element 94. Such a stacked arrangement can include additional assemblies and can be ultimately attached to a printed circuit board ("PCB") or the like for use in an electronic device. In such a stacked arrangement, metal elements 40 and conductive elements 30 and 32 can carry multiple electronic signals therethrough, each having a different signal potential to allow for different signals to be processed by different microelectronic elements, such as microelectronic element 60 or microelectronic element 92, in a single stack. Solder masses 94 can be used to interconnect the microelectronic assemblies 10,90 in such a stack, such as by electronically and mechanically attaching end surfaces 42 to conductive elements 92.

Figure 3:
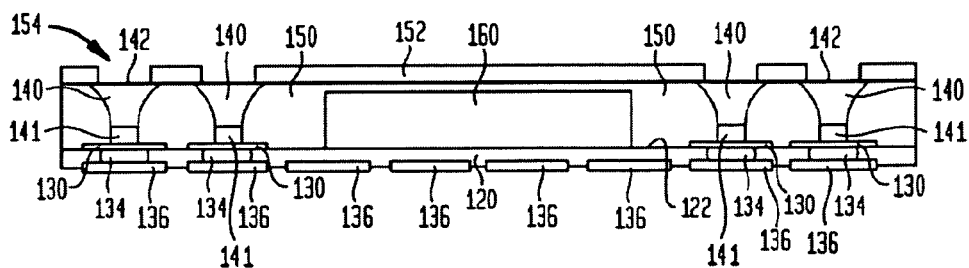
FIG. 3 shows a variation of a microelectronic assembly according to an alternative embodiment.

The embodiment of FIGS. 1 and 2 shows a formation of encapsulant layer 50 wherein a major surface 52 thereof is formed in a co-planar relationship with end surfaces 42 of the metal elements such that a substantially contiguous surface is formed thereby. Other arrangements for encapsulant layer 50 are contemplated that result in different relationships between major surface 52 and end surfaces 42. An example of such an embodiment is shown in FIG. 3, wherein metal elements 140 are shorter than encapsulant layer 150. This arrangement results in end surfaces 142 being disposed within encapsulant layer 150, or beneath major surface 152. In this embodiment end surfaces 142 are exposed at major surface 152 within holes 154 in encapsulant layer 150. Holes 154 can be substantially the same cross-sectional size as end surfaces 142 or slightly smaller than end surfaces 142. Holes 154 can be sized so as to be large enough to achieve a reliable connection to end surfaces 142.

Figure 4:
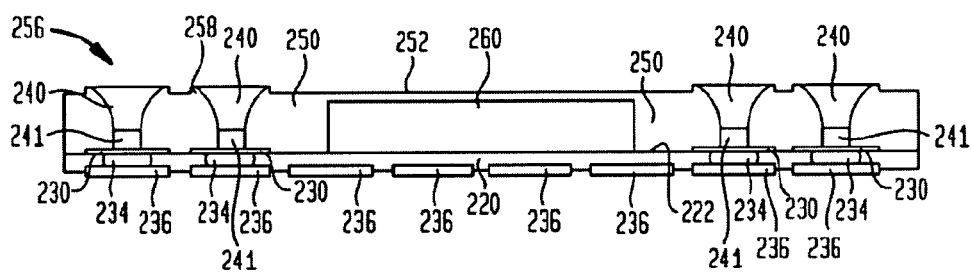
FIG. 4 shows a further variation of a microelectronic assembly according to an alternative embodiment.

In a further alternative embodiment shown in FIG. 4, metal elements 240 are formed so as to be taller than encapsulant layer 250. In this embodiment, end surfaces 242 are above, or outside of, major surface 252. In such an embodiment, a plurality of platform portions 256 can be provided within encapsulant layer 250 that correspond to conductive projections 240. Platform portions 256 can extend along edge surfaces 246 to a plurality of secondary surfaces 258 that are substantially flush with end surfaces 242.

Figure 5:
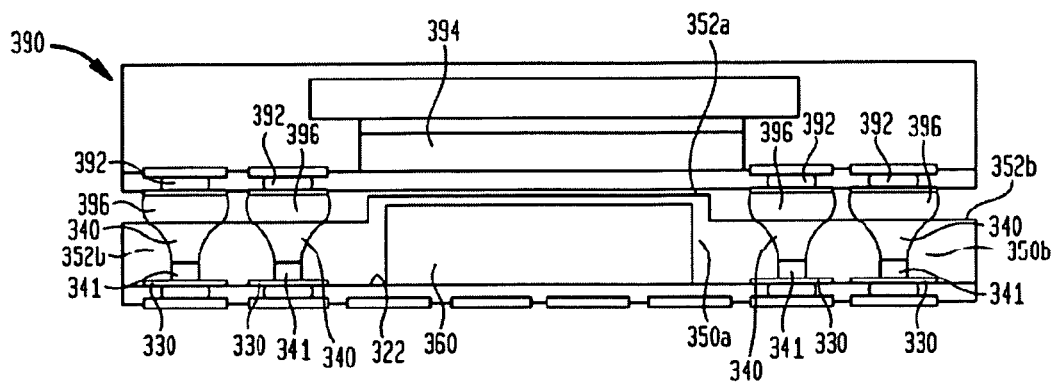
FIG. 5 shows a further variation of a microelectronic assembly according to an alternative embodiment affixed to another microelectronic assembly in a stacked relationship therewith.

As a further alternative, the encapsulant layer 350 can be formed in multiple sections having different heights. As shown in FIG. 5, encapsulant layer 350 has a first portion 350a that substantially corresponds to first region 326 of substrate 320 and a second portion 350b that substantially corresponds to second region 328. In the embodiment shown first portion 350a is such that the major surface 352a thereof is higher than the major surface 352b of second portion 350b. Also, end surfaces 342 of metal elements 340 are flush with major surface 352b and are spaced below major surface 352a. In an alternative embodiment, the relationship between major surface 352a and major surface 352b can be reversed such that major surface 352b is spaced above major surface 352a, with end surfaces 342 preferably remaining substantially flush with major surface 352b.

In FIG. 5, microelectronic assembly 310 is shown in a stacked arrangement with microelectronic assembly 390, wherein a plurality of solder masses 396 connect end surfaces 342 to conductive elements 392. In this arrangement solder masses 396 are sufficiently high enough to compensate for the taller first region 350a.

Figure 6:
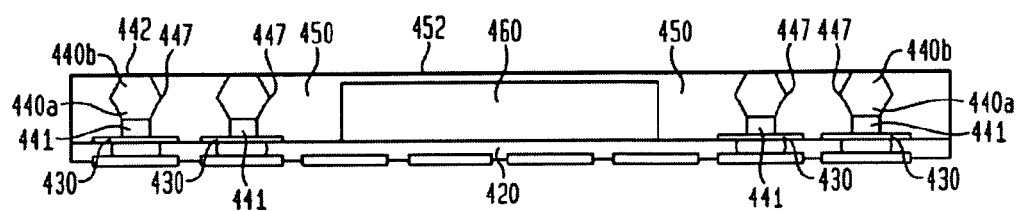
FIG. 6 shows a further variation of a microelectronic assembly according to an alternative embodiment.

As mentioned above, alternative arrangements of the metal elements 40 shown in FIG. 1 are contemplated. One alternative embodiment is shown in FIG. 6, wherein metal element 440 is further divided into a base portion 440a and an end portion 440b. Base portion 440a includes base 444 and a portion of edge surface 446 extending away therefrom toward end surface 442. Similarly, end portion 440b includes end surface 442 and a portion of edge surface 446 extending therefrom toward base 444. Metal element 440 is formed such that the portion of edge surface 446 within base portion 440a slopes outwardly to face first surface 422. The portion of edge surface 446 within end portion 440b slopes inwardly to face away from first surface 422 such that the slope of edge surface 446 changes abruptly at a boundary formed between base portion 440a and end portion 440b. In an embodiment, this boundary forms ridge 447 in edge surface 446, dividing base portion 440a from end portion 440b. Ridge 447, or another abrupt transition, can be located in any one of an infinite number of positions between base 444 and end surface 442, including near the halfway point therebetween or closer to either of base 444 or end surface 442. By forming metal elements 440 as described, an anchoring feature, such as ridge 447 is formed therein, that helps secure metal element 440 in position within encapsulant layer 450. Examples of conductive projections having anchoring features are shown and described in U.S. Patent App. Pub. No. 2008/0003402, the disclosure of which is incorporated herein in its entirety. Further examples are shown and described in U.S. patent application Ser. No. 12/838,974, the disclosure of which is incorporated herein in its entirety.

Figure 7:
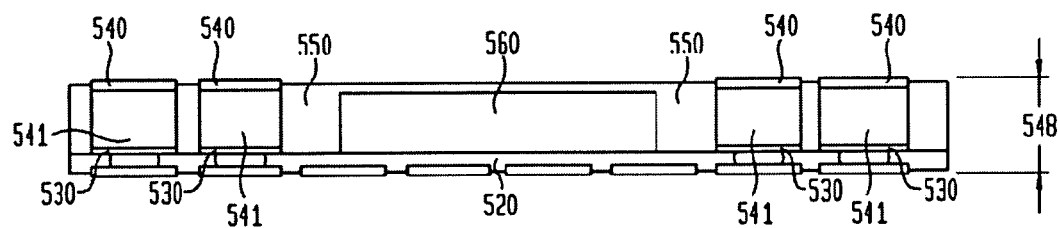
FIG. 7 shows a further variation of a microelectronic assembly according to an alternative embodiment.

A further embodiment of microelectronic assembly 510 is shown in FIG. 7, wherein bond metal masses 541 extend through a majority of the height 548 of encapsulant layer 550. In such an embodiment, bond metal mass 541 preferably extends through at least about 60% of the height 548. In an embodiment, bond metal mass 541 extends through about 80% to 90% of the height 548. The percentage of bond metal mass 541 extends is measured as the portion thereof that is fully between base 544 of metal element 540 and face 432 of conductive element 430. Further, in such an embodiment, metal element 540 is formed as a substantially circular contact pad that sits substantially atop bond metal mass 541.

Figure 8:
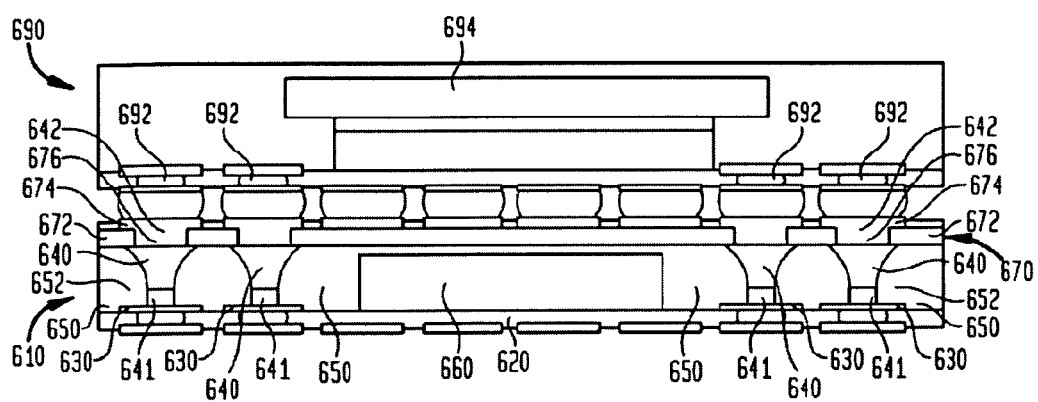
FIG. 8 shows a further variation of a microelectronic assembly according to an alternative embodiment affixed to another microelectronic assembly in a stacked relationship therewith.
Figure 9:
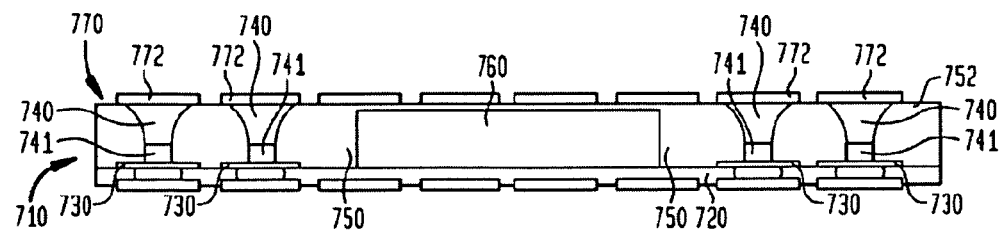
FIG. 9 shows a further variation of a microelectronic assembly according to an alternative embodiment.

FIGS. 8 and 9 show further alternative embodiments of a microelectronic subassembly having an upper redistribution layer. In FIG. 8 redistribution layer 670 is formed as a second substrate 672 that is assembled on major surface 652 of encapsulant layer 650. Redistribution layer further includes a plurality of contact pads 674 exposed at a surface of substrate 672. Contact pads 674 are preferably interconnected by a series of traces (not shown) formed in substrate 672 and can be interconnected to end surfaces 642 by conductive vias 676 formed in substrate 672.

The redistribution layer 770 of FIG. 9 is similar in structure to that of FIG. 8 but is formed directly on major surface 752 of encapsulant layer 750. That is, traces are formed connecting end surfaces 742 to contact pads 774 formed on major surface 752.

A method for making a microelectronic assembly, such as that shown in FIG. 1 is shown in FIGS. 10-13. In this method, a subassembly 12 is provided having carrier 80 with a first surface 82. Solid metal elements 40 are formed on first surface 82 of carrier 80. End surfaces 42 of metal elements 40 are removably affixed on surface 82 such that bases 44 are remote therefrom. Metal elements 40 can be formed on carrier 80 by a number of known methods including by plating layers of metal in the desired locations for metal element 40. Alternatively, metal elements 40 can be formed by depositing a layer of metal on carrier 80 and by selectively etching away areas outside of the desired areas for metal elements 40. Such etching can be done using known chemical compositions, lasers, or other known means.

Figure 11:
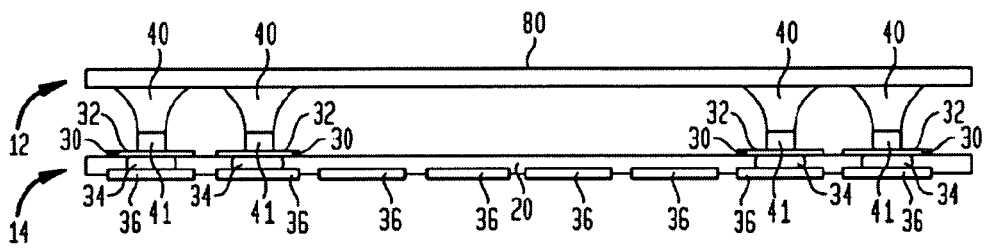
Figure 12:
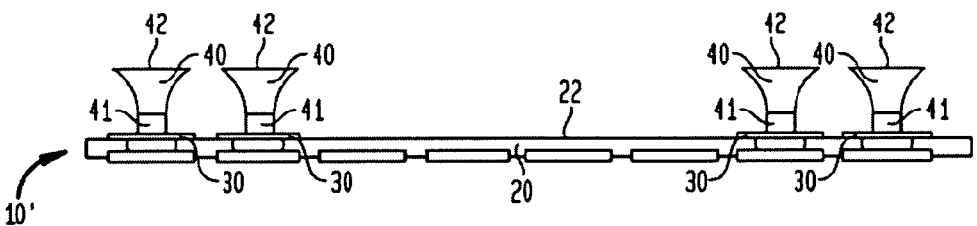

FIG. 11 shows a subsequent step of the method wherein subassembly 12 is aligned with a second subassembly 14 that includes substrate 20 and conductive elements 30 of, for example, the finished microelectronic assembly of FIG. 1. This alignment is such that metal elements 40 are substantially aligned with corresponding ones of the conductive elements 30. Bases 44 of the metal elements 40 can be held spaced apart from contact pads 30 at a desired distance. As shown in FIG. 12, bond metal masses 41 are provided between base 44 and the corresponding contact pad 30. Bond metal masses 41 can be provided by first being deposited on conductive elements 30, on metal elements 40, or in portions on each thereof. This can be done either prior to or after the step of aligning the metal elements 40 with conductive elements 30.

As shown in FIG. 12, carrier 80 is then removed from the assembly 10' resulting from the step shown in FIG. 11. This can be completed by methods known in the art including peeling, lapping or etching. As shown in FIG. 12, once the carrier 80 has been removed, end surfaces 42 of metal elements 40 are exposed remote from surface 22 of substrate 20.

Figure 13:
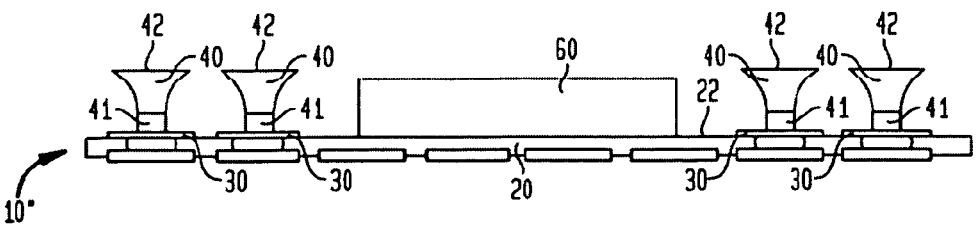

FIG. 13 shows a step in which microelectronic element 60 is affixed on substrate 20. This can be done in a method in accordance with any of the attachment means described with respect to FIG. 1 including face up or flip-chip bonding. The resulting structure of microelectronic assembly 10" can also be achieved by affixing microelectronic element 60 to substrate 20 before the step shown in FIG. 11.

Figure 10:
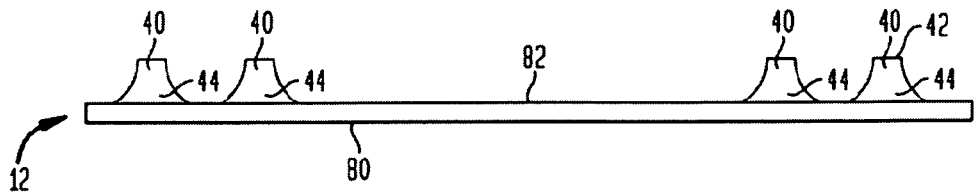
FIGS. 10-13 show successive steps used in a method for forming a microelectronic assembly such as that shown in FIG. 1.

Microelectronic assembly 10 is achieved by applying an encapsulant layer, such as those shown in FIGS. 1-5 by known means including injection molding. A method for injection molding an encapsulant layer that can be adapted, as would be understood by one of ordinary skill in the art upon reading this disclosure, for the present embodiments is described in U.S. Patent App. Pub. No. 2010/0232129 ("the '129 Publication"), the disclosure of which has been incorporated by reference herein in its entirety. In general, encapsulant layer can be molded onto assembly 10" by placing the assembly in a mold sized to receive assembly 10" therein and sized to form a cavity therein that is, essentially, a negative of the desired shape for encapsulant layer 50 (similar to what is shown in FIG. 10 of the '129 Publication). A dielectric material is then injected into the cavity through a port to fill the mold cavity such that first surface 22 of substrate 20, edge surfaces 46 of metal elements 40, and any exposed portions of bond metal masses 41 or conductive elements 30 are covered by the dielectric material and such that the dielectric material fills the cavity to form the desired shape of encapsulant layer 50. Additionally, it may be desired for encapsulant layer 50 to also cover microelectronic element 60, as shown in FIG. 1.

The mold (such as mold 420 in FIG. 10 of the '129 Publication) used in forming the encapsulant layer 50 can cover end surfaces 42 so that the end surfaces remain exposed at a surface of encapsulant layer 50. The embodiment of mold 420 shown in FIG. 10 of the '129 Publication includes a raised central portion that is suitable for making an encapsulant layer as shown in FIG. 5 with a higher major surface 352a over first region 26 of substrate 20. Other embodiments of a mold can include a substantially continuous major surface for making an encapsulant layer 50 as shown in FIG. 1. Further, the upper surface of the mold can include a plurality of indentations over the areas of the metal elements to form a package of the type shown in FIG. 4 having raised platform portions 256 in the area of metal elements 240.

An encapsulant layer 150 similar to the one shown in FIG. 3 can be formed by including projections in the mold that correspond to the desired location for holes 154 that extend to and cover ends 142 of metal elements 140. Alternatively, encapsulant layer 150 can be formed using a mold having a substantially planar surface that corresponds to surface 152. This method will form a layer of encapsulant material that covers ends 142 of metal elements 140 that can be chemically or mechanically removed in a subsequent step that can include, for example, laser etching. Similarly, the encapsulant layer configurations shown in FIG. 1, 6 or 7 can be made that covers ends 42,442,552 of metal elements 40,440,540 that is then etched down to the desired level that exposes ends 42,442,542. An encapsulant layer according to FIGS. 4 and 5 can be made in a similar manner as well, including etching down the portion of the encapsulant layer 250 that forms major surface 252, while leaving platform projections 256, (FIG. 4) or by etching down the portion of encapsulant layer 350 that forms the lower major surface 352b of FIG. 5.

Figure 12A:
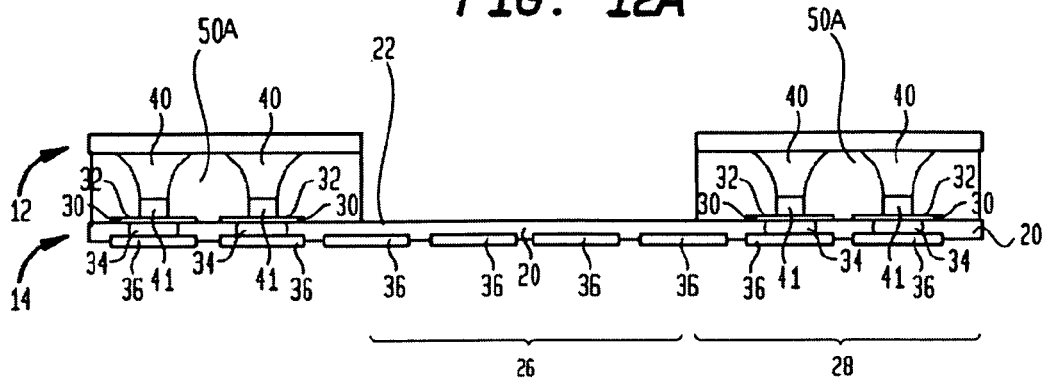
FIGS. 12A, 13A, 13B show successive steps used in an alternative method for forming a microelectronic assembly such as that shown in FIG. 1.
Figure 13A:
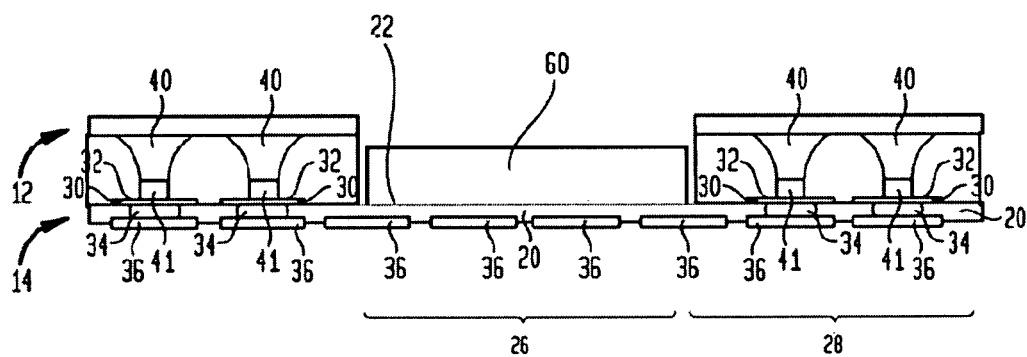
Figure 13B:
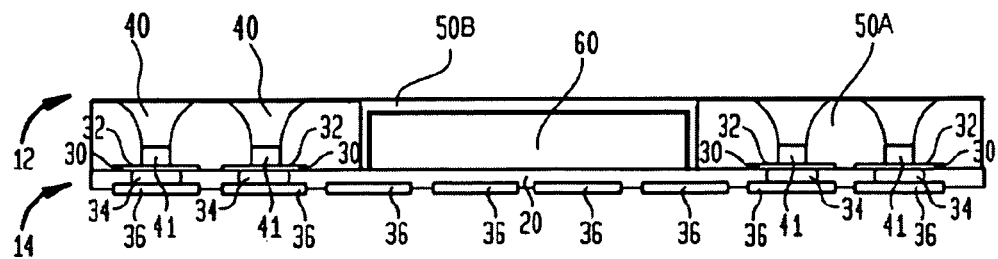

In an alternative embodiment, encapsulant layer 50 (FIG. 1) can be formed in stages, such as shown in the example of FIGS. 12A, 13A, and 13B. For example, with reference to FIG. 12A, encapsulant layer 50 can be formed in a first stage wherein a first portion 50A of encapsulant layer 50 is made to substantially cover the portion of first surface 22 that lies within the second region 28 of the substrate 20, also extending along edge surface 46 and covering any otherwise uncovered portions of bond metal masses 41 and conductive elements 30. In a subsequent step, a second portion of encapsulant layer 50 can be formed over the portion of the first surface 22 that lies within first region 26 of substrate 20. This second portion, for example, can cover microelectronic element 60, which can be affixed on substrate 20 either before the first molding stage for encapsulant layer 50 or thereafter. FIG. 13A illustrates an example where microelectronic element 60 is affixed on substrate 20 after the first molding stage shown in FIG. 12A. FIG. 13B illustrates the second portion 50B of encapsulant 50 formed over the portion of the first surface 22 that lies within first region 26 of substrate 20.

An additional method step can be completed to form conductive projections 340 having an anchoring features such as that shown in FIG. 6. This step can include etching conductive projections 40 such as those shown in FIG. 12 in an assembly such as 10" from above end surface 42. By applying a mask layer on end surface 42 and etching away a part of the metal element 40 below end surface 42, the shape of solid metal portion 340b in FIG. 6 can be achieved. Further methods for achieving conductive projections are described in U.S. Patent App. Pub No. 2008/003402 and U.S. patent application Ser. No. 12/838,974, the disclosures of which have been incorporated by reference.

Figure 14:
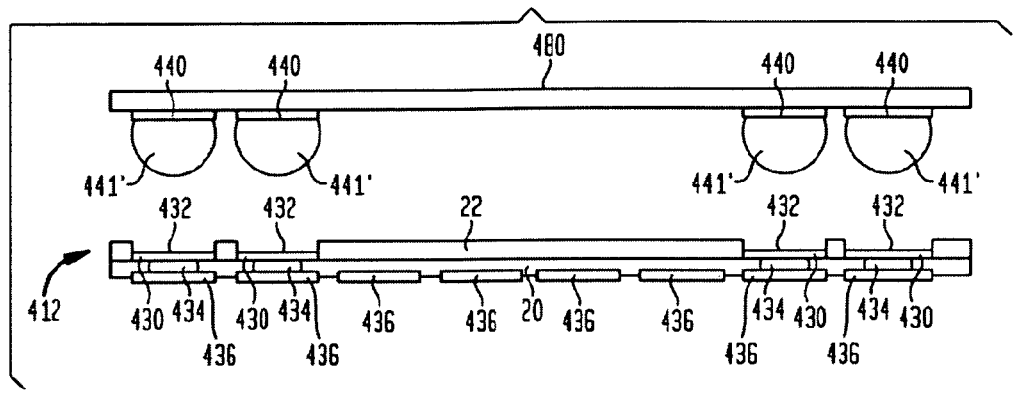
FIGS. 14-16 show successive steps used in a method for forming a microelectronic assembly such as that shown in FIG. 7.
Figure 15:
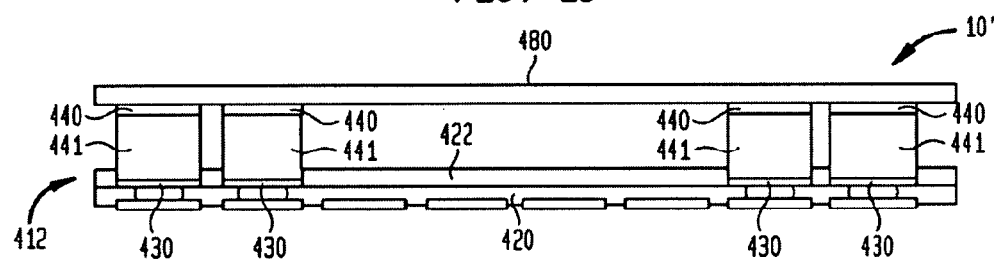
Figure 16:
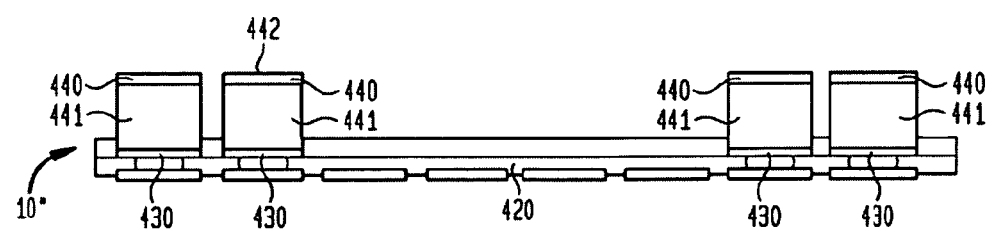
Figure 17:
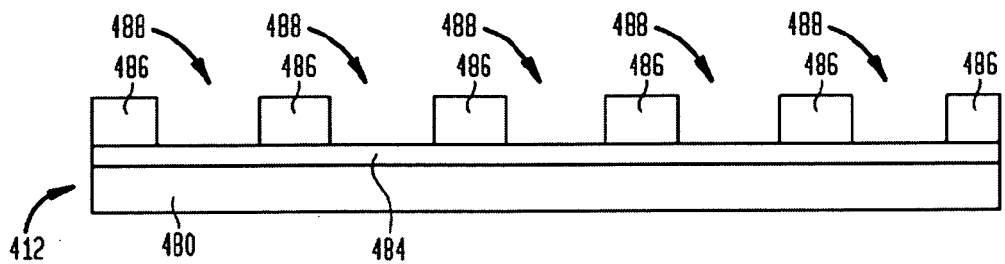
FIGS. 17-22 show successive steps used in an alternative method for forming a microelectronic assembly such as that shown in FIG. 7.
Figure 18:
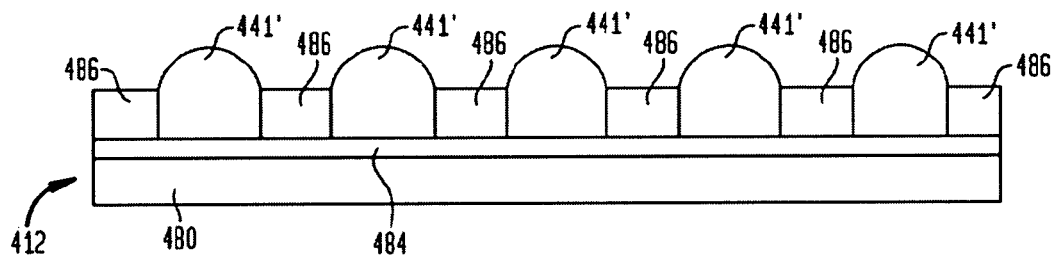

FIGS. 14-16 show steps of a method that adapts the method described above and shown in FIGS. 10-13 to form the microelectronic assembly 410 shown in FIG. 7. In this method, metal elements 440 are formed on first surface 482 of carrier 480 removably affixed thereto and bond metal masses 441 are formed as solder bumps 441' affixed on metal elements 440. As shown in FIG. 14, subassembly 412 is aligned over substrate 420 having conductive elements 430 exposed at first surface 422 thereof such that solder bumps 441' are aligned with corresponding ones of the conductive elements 430 and such that first surface 482 of carrier 480 faces first surface 422 of substrate 420.

As shown in FIG. 15, metal elements 440 are affixed on conductive elements 430 by heating solder bumps 441' to reflow the solder. Once reflown, the surface tension of the solder along with the wicking of the solder along the conductive elements 430 causes the solder bumps to form the substantially cylindrical shape of the bond metal masses 441 shown in FIG. 15. Subsequently, carrier 480 is removed, as discussed above with respect to FIG. 12, and the resulting microelectronic assembly 410" is further finished, which can be done according to the steps discussed above with respect to FIGS. 12 and 13.

FIGS. 17-22 show an additional or alternative method for making microelectronic assembly 410 shown in FIG. 7. In this method, a substantially rigid metal layer 484 is formed on first surface 482 of carrier 480. A solder mask layer 486 is then formed over rigid metal layer 484. Holes 488 are formed, either during formation of the solder mask layer 486 or are patterned therein after its formation. Holes 488 are formed over portions of rigid metal layer 484 that are designated to subsequently form metal elements 440. Solder bumps 441' are deposited within holes 488 so that holes 488 act as a partial mold to give bumps 441' a substantially cylindrical shape along at least a portion thereof.

Figure 19:
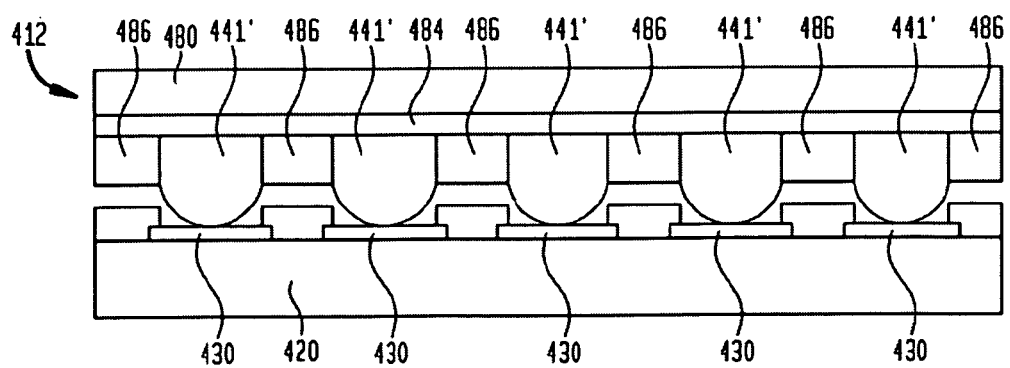

As shown in FIG. 19, subassembly 412 is aligned above substrate 420 such that solder bumps 441' align with corresponding ones of the conductive elements 430 exposed at first surface 422. As an alternative, solder mask layer 486 can be removed, either by chemical or mechanical means, and solid metal layer 484 can be etched, for example using laser etching or the like, to form metal elements 440, resulting in a subassembly similar to subassembly 412 shown in FIG. 14, except with substantially cylindrical portions formed therein by the holes 488 of solder mask layer 486.

Figure 20:
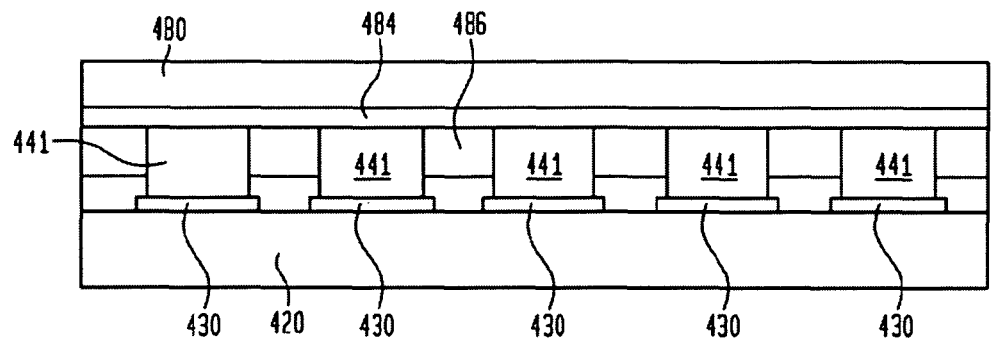
Figure 21:
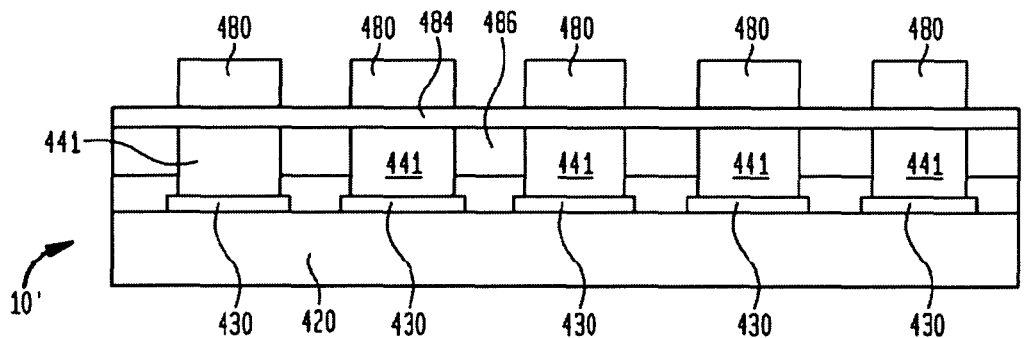
Figure 22:
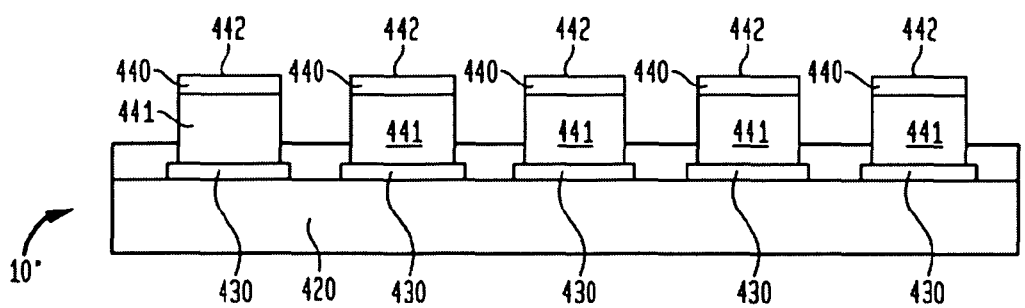

As shown in FIG. 20, solder bumps 441' are then reflown by applying heat thereto. This forms solder bumps 441' into bond metal masses 441 and affixes metal elements 440 to conductive elements 430. Carrier 480 is then selectively removed, such as by mechanical processing or etching, leaving behind mask portions 480' above solid metal layer 484. An etching process is then applied to solid metal layer 484 into separate metal elements 440, as shown in FIG. 21. Mask portions 480' are then removed exposing end surfaces 442. Solder mask layer 486 can then be removed, as shown in FIG. 22, or can be left in place to form part of encapsulant layer 450. The resulting assembly 410" is then finished in accordance with selected ones of the steps described above.

Figure 23:
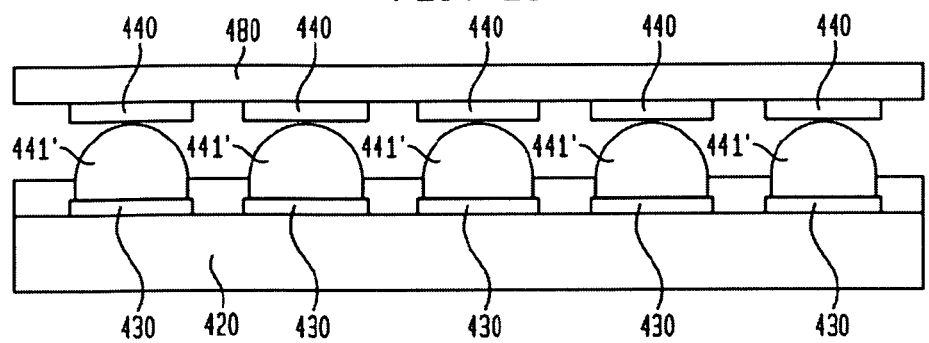
FIGS. 23-25 show successive steps used in a further alternative method for forming a microelectronic assembly such as that shown in FIG. 7.
Figure 24:
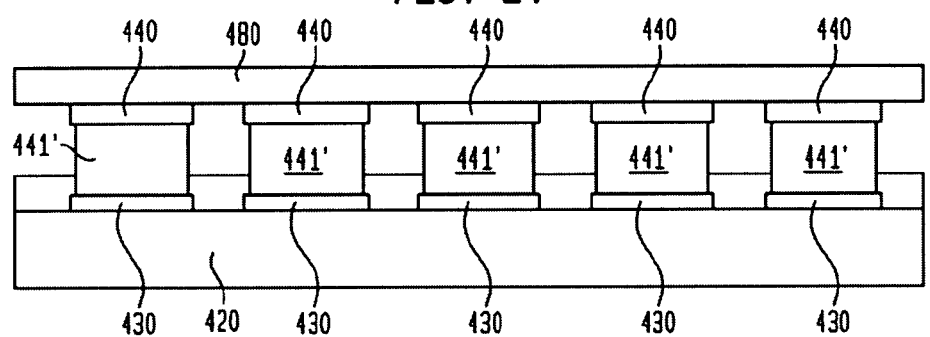
Figure 25:
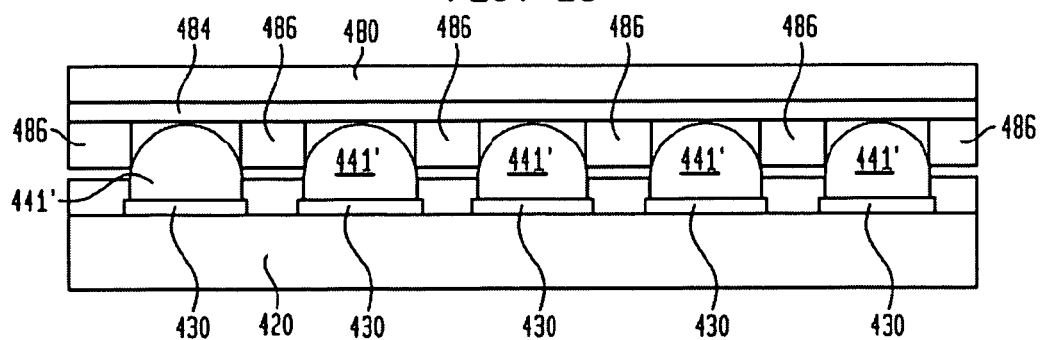

Further alternative steps are shown in FIGS. 23-25 for making a microelectronic assembly 410, as shown in FIG. 7. In these steps, solder bumps 441' are formed on conductive portions 430, with metal elements 440 formed on carrier 480, either as individual elements (FIG. 23) or within a solid metal layer 484 (FIG. 25). Solder bumps 441' are then reflown to form bond metal masses 441. As shown in FIG. 25, a solder mask layer 486 having corresponding holes 488 formed therein can also be applied over solid metal layer 484 to act as a mold to give bond metal portions 440a a substantially cylindrical shape. After reflow, the structure shown in FIG. 25 will be substantially similar to the structure shown in FIG. 20 and can be finished according to the steps described with respect thereto. The carrier 480 shown in FIG. 24 can be removed resulting in a structure similar to that of FIG. 16 and can be finished according to the steps described with respect thereto.

Figure 26:
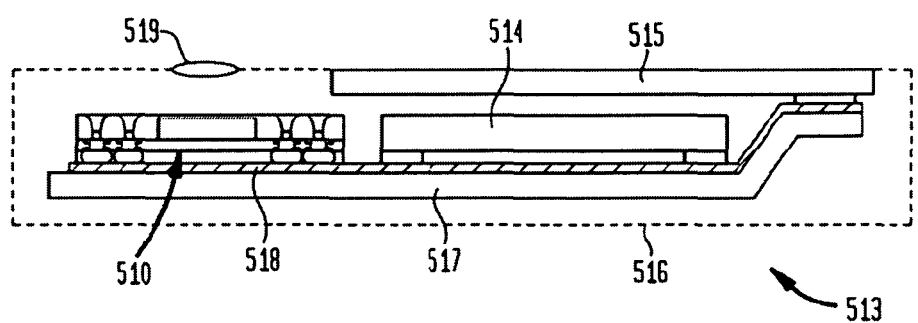
FIG. 26 shows a system including a microelectronic assembly according to the embodiment shown in FIG. 1.

The structures discussed above can be utilized in construction of diverse electronic systems. For example, a system 513 in accordance with a further embodiment of the invention includes microelectronic assembly 510 as described above in conjunction with other electronic components 514 and 515. In the example depicted, component 514 is a semiconductor chip whereas component 515 is a display screen, but any other components can be used. Of course, although only two additional components are depicted in FIG. 26 for clarity of illustration, the system may include any number of such components. The microelectronic assembly 510 as described above may be, for example, a microelectronic assembly as discussed above in connection with FIG. 1, or a structure incorporating plural microelectronic assemblies as discussed with reference to FIG. 2. Assembly 510 can further include any one of the embodiments described in FIGS. 3-25. In a further variant, multiple variations may be provided, and any number of such structures may be used.

Microelectronic assembly 510 and components 514 and 515 are mounted in a common housing 516, schematically depicted in broken lines, and are electrically interconnected with one another as necessary to form the desired circuit. In the exemplary system shown, the system includes a circuit panel 517 such as a flexible printed circuit board, and the circuit panel includes numerous conductors 518, of which only one is depicted in FIG. 26, interconnecting the components with one another. However, this is merely exemplary; any suitable structure for making electrical connections can be used.

The housing 516 is depicted as a portable housing of the type usable, for example, in a cellular telephone or personal digital assistant, and screen 515 is exposed at the surface of the housing. Where microelectronic assembly 510 includes a light-sensitive element such as an imaging chip, a lens 519 or other optical device also may be provided for routing light to the structure. Again, the simplified system shown in FIG. 26 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for making a microelectronic package, comprising:
providing a microelectronic assembly including a first substrate having a first surface with a plurality of electrically conductive elements exposed thereon, a carrier having a second surface spaced apart from the first surface of the substrate, and a plurality of substantially rigid metal elements extending from the carrier and joined to the electrically conductive elements, the first surface of the first substrate including first and second regions, the electrically conductive elements being exposed at the first surface within the first region;
injecting a dielectric material between the first and second surfaces and around the plurality of substantially rigid metal elements to form a molded dielectric layer;
removing the carrier from the microelectronic assembly, thereby exposing contact surfaces of respective ones of the plurality of substantially rigid metal elements remote from the plurality of electrically conductive elements; and
affixing a microelectronic element to the first substrate and electronically connecting the microelectronic element to at least some of the electrically conductive elements after the step of removing the carrier,
wherein the microelectronic element is attached on the first surface within the second region, and wherein the molded dielectric layer is formed in a first dielectric layer portion and a second dielectric layer portion by the steps of:
forming the first dielectric layer portion over the first region of the first surface prior to the step of attaching the microelectronic element; and
forming the second dielectric layer portion over the second region of the first surface after the step of attaching the microelectronic element.

2. The method of claim 1, wherein the step of injecting is prior to the step of removing the carrier.

3. The method of claim 1, wherein each of the plurality of substantially rigid metal elements are joined to respective ones of the conductive elements through a bond metal.

4. The method of claim 1, wherein the step of removing the carrier includes at least one of etching, lapping or peeling the carrier.

5. The method of claim 1, further including forming the microelectronic assembly from a first subassembly including the first substrate and the conductive elements and a second subassembly including the carrier and the plurality of substantially rigid metal elements, wherein the plurality of substantially rigid metal elements are exposed at first surfaces remote from the second surface, and wherein the microelectronic assembly is formed by attaching the first surfaces of the plurality of substantially rigid metal elements to the conductive elements of the second subassembly.

6. The method of claim 5, wherein the step of forming the first microelectronic assembly includes attaching at least the first surfaces of the plurality of substantially rigid metal elements to the plurality of conductive elements of the second assembly by forming a plurality of masses of a bonding metal that are affixed to the first surfaces of the conductive projections and to respective ones of the conductive elements such that at least a portion of the bonding metal is disposed between the first surfaces and the conductive elements.

7. The method of claim 6, wherein the bonding metal masses are formed by depositing solder on one of the group consisting of the conductive projections and the conductive elements.

8. The method of claim 1, wherein the microelectronic assembly further includes a microelectronic element affixed on the substrate and electronically connected to at least some of the conductive elements.

9. The method of claim 8, wherein the microelectronic element is included in the microelectronic assembly by a step of affixing the microelectronic element on the first substrate carried out prior to the step of removing the carrier.

10. The method of claim 8, wherein the first surface of the first substrate includes first and second regions, the conductive elements being exposed at the first surface within the first region and the microelectronic element being attached on the first surface within the second region, the method further including molding a dielectric layer over the first and second regions of the first surface and at least a portion of said microelectronic element, wherein the molded dielectric layer includes an outer surface, and wherein the contact surfaces of the plurality of substantially rigid metal elements are exposed at the outer surface of the molded dielectric layer.

11. The method of claim 5, wherein the second subassembly is formed by a method including the step of forming the plurality of substantially rigid metal elements on the second surface of the carrier.

12. The method of claim 11, wherein the step of forming the plurality of substantially rigid metal elements includes selectively etching a metal layer on a carrier such that selected portions of the metal layer form the plurality of substantially rigid metal elements.

13. The method of claim 1, wherein the microelectronic assembly is formed by the steps of:

depositing a plurality of masses of a bonding metal on the conductive elements; and affixing a structure to the plurality of masses, the structure including the carrier and a rigid metal layer, such that the plurality of masses are exposed at selected areas of the rigid metal layer that form the plurality of substantially rigid metal elements.

14. A method for making a microelectronic package, comprising:

providing a microelectronic assembly including a first substrate having a first surface with a plurality of electrically conductive elements exposed thereon, a carrier having a second surface spaced apart from the first surface of the first substrate, and a plurality of substantially rigid metal elements extending from the carrier and joined to the conductive elements;

forming the microelectronic assembly from a first subassembly including the first substrate and the conductive elements and a second subassembly including the carrier and a plurality of substantially rigid metal elements formed on the second surface of the carrier, the second subassembly being formed by affixing a rigid metal layer to the second surface of the carrier and depositing a mask layer having a plurality of openings therethrough over the rigid metal layer, the plurality of openings exposing the selected portions of the rigid metal layer, depositing masses of a bonding metal within the plurality of openings and along selected portions of the rigid metal layer such that outer surfaces are defined on the masses of the bonding metal, and removing areas of the rigid metal layer outside of the selected portions thereof; and removing the carrier from the microelectronic assembly, thereby exposing contact surfaces of respective ones of the plurality of rigid metal elements remote from the plurality of electrically conductive elements, wherein the plurality of substantially rigid metal elements are exposed at the outer surfaces remote from the second surface of the carrier, and wherein the microelectronic assembly is formed by attaching the outer surfaces of the plurality of substantially rigid metal elements to the conductive elements of first subassembly.

15. The method of claim 14, further including the step of removing the mask layer.

16. The method of claim 14, wherein the mask layer acts as at least a portion of an encapsulant layer after the step of transferring the plurality of substantially rigid metal elements.

* * * * *

UNITED STATES PATENT AND TRADEMARK OFFICE
CERTIFICATE OF CORRECTION

PATENT NO. : 9,324,681 B2  
APPLICATION NO. : 14/497572  
DATED : April 26, 2016  
INVENTOR(S) : Belgacem Haba and Ilyas Mohammed Page 1 of 1

It is certified that error appears in the above-identified patent and that said Letters Patent is hereby corrected as shown below:

In the claims,

In column 16, line 13, replace "rigidmetal" with "rigid metal"

Signed and Sealed this  
Twelfth Day of July, 2016

Michelle K. Lee  
*Director of the United States Patent and Trademark Office*